United States Patent [19]

Boehler

[11] 4,193,186

[45] Mar. 18, 1980

[54] ROTARY INDEXING APPARATUS FOR AUTOMATIC DEVICE INSERTION ON PRINTED CIRCUIT BOARDS

[75] Inventor: Rolf Boehler, Dorchester, Canada

[73] Assignee: Northern Telecom Limited, Montreal, Canada

[21] Appl. No.: 938,937

[22] Filed: Sep. 1, 1978

[51] Int. Cl.² ............................................. H05K 3/30
[52] U.S. Cl. ....................................... 29/741; 29/742; 29/759; 29/760; 198/803
[58] Field of Search ................. 29/741, 742, 759, 760; 198/803

[56] References Cited

U.S. PATENT DOCUMENTS

| 756,298 | 4/1904 | Tench | 198/803 X |
| 3,390,756 | 7/1968 | Edwards et al. | 198/803 X |
| 4,080,730 | 3/1978 | Woodman, Jr. | 29/741 X |

Primary Examiner—Carl E. Hall
Attorney, Agent, or Firm—Sidney T. Jelly

[57] ABSTRACT

A rotary indexing apparatus for automatic insertion of devices on printed circuit boards has a main support member attached to the insertion machine and a circular locating and supporting member rotatably supported by the main support member. Apertures are provided in the circular member over which can be positioned printed circuit boards. Generally four such locations are provided, particularly for insertion machines with an inserting head which inserts devices at two positions successively. By indexing the table between each complete cycle, devices are inserted in two directions, at right angles to each other, by insertion occurring first at one location and then at another location after the circular member has been indexed.

5 Claims, 8 Drawing Figures

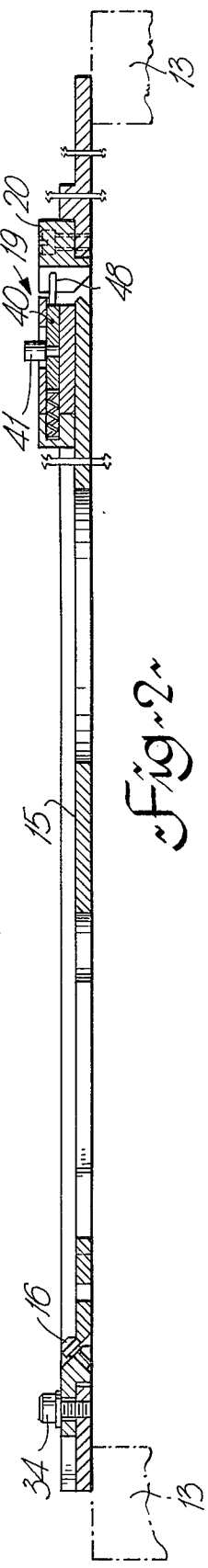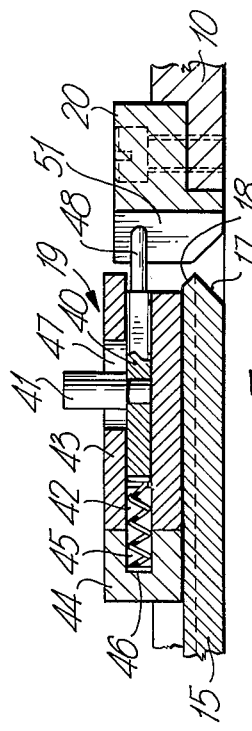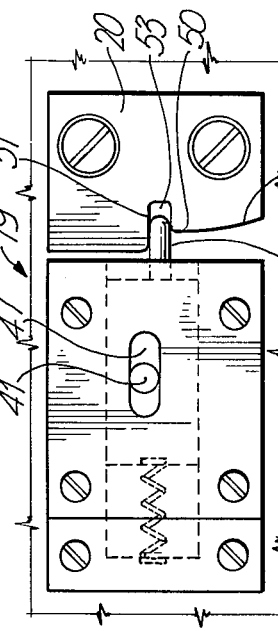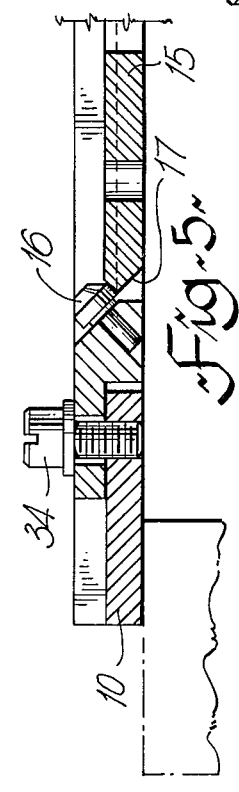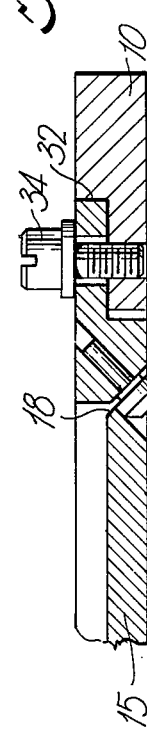

ROTARY INDEXING APPARATUS FOR AUTOMATIC DEVICE INSERTION ON PRINTED CIRCUIT BOARDS

This invention relates to a rotary indexing apparatus for automatic device insertion on printed circuit boards and is particularly concerned with such apparatus for attachment to a conventional insertion machine.

In printed circuit boards, the various devices such as resistors and capacitors are positioned so as to be capable of automatic insertion on insertion machines. In such machines the conductor wires at each end of a device are bent down and pushed through holes in the printed circuit board (PCB). The boards are held in carriers which move the boards in a predetermined path under the insertion head. The restriction of such a system is that the devices must extend parallel to each other. This is not always convenient and often the layout of the devices is arranged such that some devices are parallel to each other in one direction and other devices are parallel to each other in a direction at right angles to the first series of devices. This requires that the PCB be turned through 90° between two insertion sequences or cycles.

On a conventional machine the turning is obtained by manually rotating the PCB's between cycles. The PCB's can be turned themselves directly by removal and replacement in the machine holding member, or the PCB's may be mounted in holders which are then placed in the machine holding member. In either case it is necessary to provide some means of ensuring correct orientation is obtained for the relative cycles otherwise insertion cannot occur.

The present invention provides a rotary indexing apparatus which attaches to the moving support of the machine and which is indexed at 90° after each cycle. A cycle comprises sequential action by the machine head on two boards held in the indexing apparatus, at 90° to each other. The insertion head first inserts all devices orientated in a one direction in a first PCB and then the head moves to insert all devices orientated in the one direction in a second board. The apparatus is then indexed through 90° and the insertion head moves back to its original position and inserts devices, orientated in the one direction. However it will be appreciated that there will be insertion with the second PCB which has been turned through 90° and thus the second set of devices will be at 90° to the set inserted at the previous stage. The head then moves to insert all the devices of the one orientation in the next PCB, indexing occurs, the insertion head moves back and this operation continues.

The apparatus comprises a support plate for attachment to the machine support member with a rotatable PCB locating and support member supported in the support plate. Indexing stops are provided and a plurality of PCB positions—generally four—are provided in the rotatable locating and support member.

The invention will be readily understood by the following description in conjunction with the accompanying drawings, in which:

FIG. 2 is a cross-section on the line II—II of FIG. 1;

FIG. 3 is a cross-section on the line III—III of FIG. 1;

FIG. 5 is the left hand portion of FIG. 2 to a larger scale;

FIG. 6 is a cross-section on the line VI—VI of FIG. 1;

FIG. 7 is a cross-section on the line VII—VII of FIG. 1;

FIG. 8 is a top plan view of the latching mechanism illustrated in FIG. 7.

Figure 1:
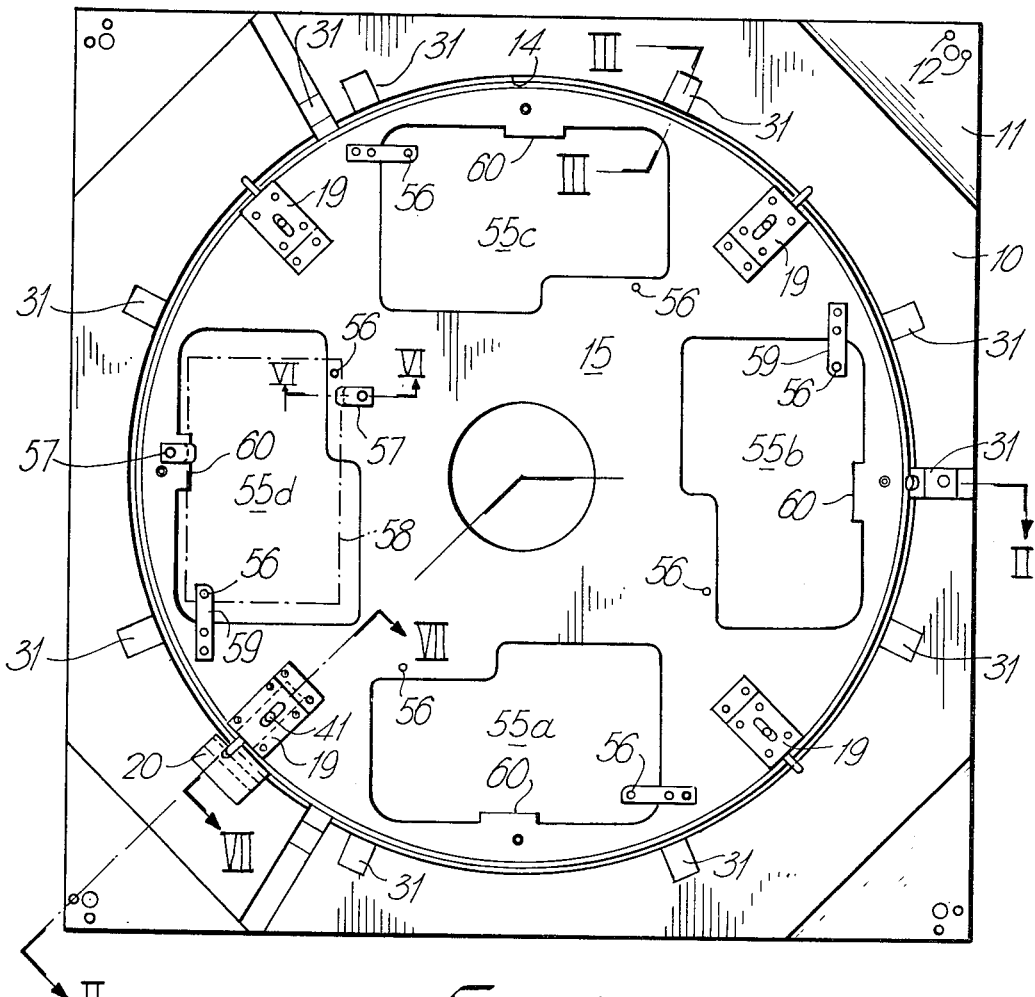
FIG. 1 is a top plan view of the apparatus.

As illustrated the apparatus comprises a square plate 10 having the corners 11 reduced in thickness and holes 12 for attachment bolts which attach the support plate 10 to the insertion machine, indicated at 13 in FIG. 2.

The support plate 10 is machined to provide a large central circular aperture 14 in which is rotatably mounted a PCB locating and support member 15. The support member 15 is rotatably located and supported in the aperture by rollers 16 which conveniently are ball or roller bearings. In the particular example there are eight rollers extending under the support member and three extending over the support member.

The periphery of the support member 15 is machined to provide two surfaces 17 and 18 at right angles and the lower rollers 16 run on the lower surface 17 and the upper rollers 16 run on the surface 18. This provides good support and radial location beneath the edge of the support member 15 and prevents tipping of the support member. Also provided are four latching mechanisms 19 on the support member 15 and one stop 20 on the support plate 10.

Figure 4:
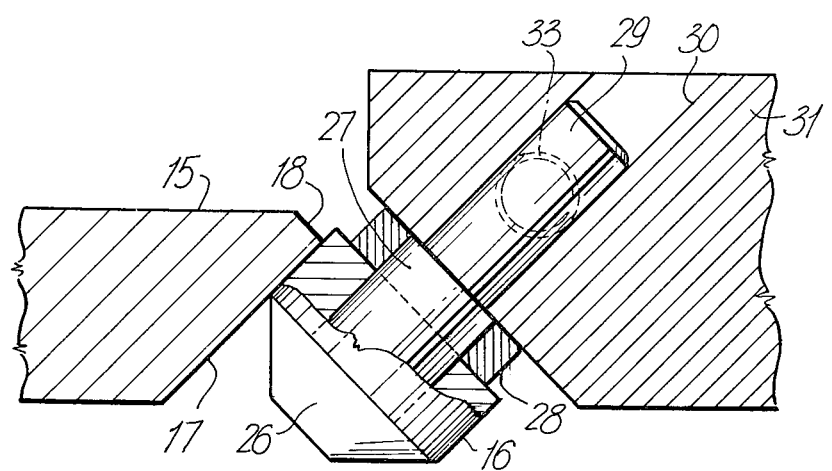
FIG. 4 is a cross-section as in FIG. 3 but to a larger scale.

The arrangement of one of the lower rollers 16 is illustrated in more detail and to a larger scale in FIG. 4. The roller 16 is conveniently the outer race of a ball or roller bearing mounted on a pin having a enlarged head 26, a main portion 27 on which is positioned the roller 16 and a spacer 28, and an end portion 29 of reduced diameter, positioned in a hole 30 in a mounting member 31. Mounting member 31 fits into a recess 32 in the support plate 10, as in FIG. 1. The same arrangement is used for each lower roller 16 and a similar arrangement for the upper rollers, the main difference being that the holes 30 for the upper rollers are inclined at 90° relative to the holes 30 for the lower rollers. The pins 25 are held in the member 31 by a screw 33. The mounting members 31 are held in the recesses 32 by bolts 34, and are only indicated in general outline in FIG. 1.

FIGS. 2, 7 and 8, in association with FIG. 1, illustrate the latching mechanisms for regulation of the rotation of the locating and support member 15. The mechanisms 19 each comprise a radially sliding rod 40 with a knob 41 extending upwardly therefrom. The rod 40 slides in a bore 42 in a block 43 attached to the member 15. An end block 44 abuts the inner end of the block 43 and has a recess 45 which houses one end of a compression spring 46, the other end of the spring acting on the inner end of the rod 40 in the bore 42. The knob 41 extends up through a slot 47 in the top of the block 43. The outer end 48 of the rod 40 is slightly reduced in diameter. On the support plate 10 is mounted one stop 20 which is in the form of a block having one corner recessed—at 50. In the arrangement illustrated in FIG. 1, the locating and support member 15 rotates anticlockwise and thus each latching member approaches the stop from the right as considered in FIG. 1.

It is the inner right hand corner of the stop 20 which is recessed so as to leave a buttress or engagement surface 51 against which the outer end 48 of the rod 40 locates. The surface 52 of the recessed corner 50 is normally given a slight incline, with a groove 53 immediately following, so that as the locating and support member rotates the rod 40 will ride up the surface 52 and then drop into the groove 53, accurately locating the member 15. Alternatively the end of the rod 40 can be chamfered so as to depress slightly on meeting the stop 20 and ride along the surface 52, to drop into groove 53. In such a design the surface 52 need not be inclined.

In operation, the apparatus is attached to the machine so that the stop 20 is near the front. After each insertion cycle, the knob 41 of the particular latching mechanism at the stop 20 is slid back to release the mechanism from the stop and then the member 15 rotated, in the example anticlockwise. The next latching mechanism then engages with the stop 20 for a further insertion cycle.

Formed in the rotatable locating and support member 15 are four locations defined by apertures 55a, 55b, 55c and 55d. Associated with each aperture are locating members 56 and hold-down clips 57. The apertures 55 are shaped so as to provide support for a PCB for as much as possible at the periphery and also leave clearance for the leads of the devices being inserted. Thus in the particular example the outline of a particular PCB is indicated by chain-dotted line 58. The PCB is located by a first locating member 56 on the member 15 and a second locating member 56 on an arm 59 extending into the aperture. The arm also provides support. Further support is also provided by a projection 60 and by the member 15 at the locality of the first locating member 56. The actual shape of the aperture 55 and the member 30 and positioning of the locating members and support areas can be varied and often, by suitable positioning, the member 15 with the locating members 56 will handle more than one form of PCB.

FIG. 6 illustrates in cross-section the form of the clips 57. Each clip is elongate in plan form and is mounted on the locating and support member 15 by a set screw 65. The clip is offset so that a forward part 66 will extend over the PCB. This forward part 66 is undercut, at 67, to give a recess equal to the thickness of a PCB. A spring-loaded detent 68 maintains the clip 57 in the hold down position, once moved to this position.

A PCB is positioned at one of the areas by first moving the clips 67 to have them clear of the PCB area. A PCB is then positioned on the locating members 56 and the two clips 67 rotated to the hold down position. Normally, while a PCB is being unloaded and a new PCB loaded, devices are being inserted in the preceding two PCB's. Assuming loading at aperture 55a, insertion will be proceeding in PCB's at apertures 55b and 55c. When the insertion cycle is finished, the latch mechanism 19 at the stop 20 is released and the locating and support member 15 rotated anticlockwise 90° when the next latch mechanism will engage with stop 20.

Thus, considering FIG. 1, to start up the apparatus, PCB's will be loaded initially, with indexing without actuation of the insertion head, so as to get a PCB in position at aperture 55c and at 55b. The machine can then be actuated. The head will first insert all devices with the same orientation into the PCB at 55c then move across and insert devices with this orientation in the PCB at 55b. Meanwhile a further PCB is loaded into aperture 55a.

After completion of insertion at 55b, the insertion head moves back and the support member indexed through 90°. The insertion head then inserts devices in the PCB at aperture 55c-which has been orientated through 90° and then moves across and inserts in the new PCB at 55. The original board at 55c is unloaded, when at 55d or 55a and this first board will be incomplete. A new PCB is loaded each time, at 55a and is moved in two steps for successive insertion of devices, with a 90° change in orientation between insertion steps. Thus devices are inserted in the two directions.

Conveniently a machine may have two insertion heads and two locating and support members so that two PCB's are acted upon simultaneously. Particularly in a two head machine loading and unloading can be carried out at the same position, for example at 55a in FIG. 1. Alternatively unloading can occur at one station, for example at 55d in FIG. 1, and loading at another station, for example at 55a.

Although anticlockwise rotation of the support member 15 has been described, the apparatus can readily be adapted to clockwise rotation by reversing the form of the stop 20.

In conventional insertion practice, the devices are always inserted so as to be orientated along two directions at 90°. However, it will be appreciated that in the event that it was decided to have other directions of orientation it would only be a matter of providing apertures at the necessary angular relationship together with associated latch members.

While the locating and support member 15 is normally rotated by hand it is possible to provide some form of powered rotation, possibly the electric motor actuated by suitably positioned switches. Also, while latches have been described as being mounted on the locating and support member and a stop on the support plate, this can be reversed, with a latch on the support plate and stops on the locating and support member.

What is claimed is:

1. Rotary indexing apparatus for automatic device insertion on printed circuit boards, comprising:
    a support plate for attachment to an insertion machine, said support including a central circular aperture;
    a locating and support member rotatably located and supported at its periphery in said circular aperture, said periphery of the locating and support member having two circumferential surfaces inclined at 90° to each other to provide an upper surface and a lower surface, said surfaces inclined at 45° to the plane of the locating and support member, a plurality of first rollers extending from said support plate and engaging with said lower surface, said first rollers each rotatably mounted for rotation about an axis parallel to said lower surface, and a plurality of second rollers extending from said support plate and engaging with said upper surface, said second rollers each rotatably mounted for rotation about an axis parallel to said upper surface, said pluralities of rollers rotatably locating, supporting and retaining said locating and support member in said circular aperture;
    a plurality of locations on said locating and support member, each location comprising an aperture and locating and support means associated with the aperture to hold a printed circuit board, said locations spaced around a central axis to provide predetermined angular orientations of said printed circuit boards;
    a plurality of manually operated latches on said locating and support member, a latch for each location, each latch adjacent to the related location, and a stop on the support plate, for rotationally locating said locations about said central axis for sequential positioning of said locations beneath an insertion position on said insertion machine, each of said latches comprising a radially slidable member having an outer end for engagement with said stop, and means resiliently urging said radially slidable member outwards, said stop including a member mounted on said support plate and including a recess for reception of said outer end of said radially slidable member for positive location of said locating and support member.

2. Apparatus as claimed in claim 1, comprising four locations on said locating and support member, equally spaced about said central axis, whereby printed circuit boards are oriented at 90° to each other at said locations.

3. Apparatus as claimed in claim 1, including locating means and holding means at each location for locating and holding a printed circuit board at each location.

4. Apparatus as claimed in claim 1, each latch comprising a rod supported on said locating and support member and slidable radially, said rod including an outer end for engagement with said stop, and means resiliently urging said rod radially outwards, said stop including a buttress for engagement by said outer end of said rod, and a groove immediately adjacent to said buttress for entry of said outer end of said rod.

5. Apparatus as claimed in claim 3, said holding means at said locations each comprising a rotatable clip, said clip rotatable from a first position clear of said location to a second position extending over said location to hold down the printed circuit board.

* * * * *